(12) United States Patent
Tran et al.

(10) Patent No.: US 9,202,756 B1
(45) Date of Patent: Dec. 1, 2015

(54) METHOD OF FORMING A STACKED LOW TEMPERATURE TRANSISTOR AND RELATED DEVICES

(71) Applicant: INOSO, LLC, Austin, TX (US)

(72) Inventors: Ziep Tran, Austin, TX (US); Kiyoshi Mori, Missouri City, TX (US); Giang Trung Dao, Milpitas, CA (US); Michael Edward Ramon, Austin, TX (US)

(73) Assignee: INOSO, LLC, Austin, TX (US)

( * ) Notice: Subject to any disclaimer, the term of this patent is extended or adjusted under 35 U.S.C. 154(b) by 0 days.

(21) Appl. No.: 14/805,415

(22) Filed: Jul. 21, 2015

Related U.S. Application Data

(62) Division of application No. 14/329,759, filed on Jul. 11, 2014, now Pat. No. 9,087,689.

(51) Int. Cl.
*H01L 21/82* (2006.01)
*H01L 21/86* (2006.01)

(52) U.S. Cl.
CPC ............. *H01L 21/8213* (2013.01); *H01L 21/86* (2013.01)

(58) Field of Classification Search
CPC ..................... H01L 29/66507; H01L 21/8213; H01L 21/86
USPC .......................................... 257/278, E27.026
See application file for complete search history.

(56) References Cited

U.S. PATENT DOCUMENTS

| | | | |
|---|---|---|---|
| 4,237,600 A | 12/1980 | Rosen et al. | |
| 5,006,913 A | 4/1991 | Sugahara et al. | |
| 5,569,624 A | 10/1996 | Weiner | |
| 5,612,552 A | 3/1997 | Owens | |
| 5,646,073 A | 7/1997 | Grider et al. | |
| 5,784,310 A | 7/1998 | Cuchiaro et al. | |
| 5,808,319 A | 9/1998 | Gardner et al. | |
| 5,950,082 A | 9/1999 | Gardner | |
| 6,049,092 A * | 4/2000 | Konuma | H01L 27/127 257/324 |
| 6,335,231 B1 | 1/2002 | Yamazaki et al. | |
| 7,005,356 B2 | 2/2006 | Cheong et al. | |
| 7,067,868 B2 | 6/2006 | Thean et al. | |
| 7,115,451 B2 | 10/2006 | Gonzalez | |

(Continued)

OTHER PUBLICATIONS

Yuta Tamura, "A Novel Interface Controlled Silicidation Process for Future 3D Schottky Devices", Master Thesis, 2013, Department of Electrical and Electronic Engineering, Tokyo Institute of Technology.

(Continued)

*Primary Examiner* — Lex Malsawma
(74) *Attorney, Agent, or Firm* — Haynes and Boone, LLP

(57) ABSTRACT

A method of forming a stacked low temperature transistor and related devices. At least some of the illustrative embodiments are methods comprising forming at least one integrated circuit device on a front surface of a bulk semiconductor substrate, and depositing an inter-layer dielectric on the at least one integrated circuit device. A semiconductor layer may then be deposited on the inter-layer dielectric. In some embodiments, a transistor is formed within the semiconductor layer. In some examples, the transistor includes a gate structure formed over the semiconductor layer as well as source/drain regions formed within the semiconductor layer disposed adjacent to and on either side of the gate structure. A metal layer may then be deposited over the transistor, after which an annealing process is performed to induce a reaction between the source/drain regions and the metal layer.

20 Claims, 19 Drawing Sheets

(56) References Cited

U.S. PATENT DOCUMENTS

| | | |
|---|---|---|
| 7,294,890 B2 | 11/2007 | Lo et al. |
| 7,479,673 B2 | 1/2009 | Jang et al. |
| 7,705,358 B2 | 4/2010 | Okamoto et al. |
| 7,883,980 B2 | 2/2011 | Grupp et al. |
| 7,948,040 B2 | 5/2011 | Yamazaki et al. |
| 8,203,154 B2 | 6/2012 | Wang et al. |
| 8,410,582 B2 | 4/2013 | Bandyopadhyay et al. |
| 8,907,392 B2 | 12/2014 | Yamazaki et al. |
| 2003/0068883 A1 | 4/2003 | Ajmera et al. |
| 2003/0235936 A1 | 12/2003 | Snyder et al. |
| 2008/0150026 A1 | 6/2008 | Kwon et al. |
| 2009/0001344 A1 | 1/2009 | Schricker et al. |
| 2009/0085153 A1 | 4/2009 | Maxwell et al. |
| 2013/0161713 A1* | 6/2013 | Yamazaki ............ H01L 27/108 257/296 |
| 2013/0229846 A1 | 9/2013 | Chien et al. |

OTHER PUBLICATIONS

Yang, et al, "Stability of Low-Temperature Amorphous Silicon Thin Film Transistors Formed on Glass and Transparent Plastic Substrates", J. Vac. Sci. Technol. B, Mar.-Apr. 2000, pp. 683-689.

Bipin Rajendran, "Sequential 3D IC Fabrication—Challenges and Prospects", Proceedings of VMIC, 2006.

Wei Sun, et al, "Harvesting Betavoltaic and Photovoltaic Energy with Three Dimensional Porous Silicon Diodes", MRS Proceedings, 2004, vol. 836.

"Principles of Semiconductor Devices", 2004, http://ecee.colorado.edu/~bart/book/book/chapter3/ch3_1.htm, Boulder, CO.

Mark D. Barlow, "Metal-Semiconductor Contacts for Schottky Diode Fabrication", Master Thesis, 2007, Electrical and Computer Engineering Program, Youngstown State University.

* cited by examiner

METHOD OF FORMING A STACKED LOW TEMPERATURE TRANSISTOR AND RELATED DEVICES

CROSS REFERENCE TO RELATED APPLICATIONS

The present application is a divisional app. of U.S. patent application Ser. No. 14/329,759, filed Jul. 11, 2014, now U.S. Pat. No. 9,087,689, entitled "METHOD OF FORMING A STACKED LOW TEMPERATURE TRANSISTOR AND RELATED DEVICES", which is hereby incorporated by reference in its entirety. The present application is also related to the subject matter of commonly assigned U.S. patent application Ser. No. 14/329,792, filed Jul. 11, 2014, now U.S. Pat. No. 8,916,872, entitled "METHOD OF FORMING A STACKED LOW TEMPERATURE DIODE AND RELATED DEVICES", which is hereby incorporated by reference in its entirety.

BACKGROUND

1. Technical Field

The present invention generally relates to semiconductor devices. More particularly, the present invention relates to the integration of stacked low temperature semiconductor devices with metal-oxide-semiconductor (MOS) devices and processes.

2. Description of the Related Art

The ever increasing demand of small, portable multifunctional electronic devices has led to the continued proliferation of smart phones, personal computing devices, personal audio devices (e.g., MP3 players), as well as biomedical and security devices. Such devices are expected to support and perform a greater number of increasingly complex and sophisticated functions while consuming less and less power. Such electronic devices rely on limited power sources (e.g., batteries and/or alternative energy harvesting systems) while providing ever-increasing processing capabilities and storage capacity.

Accordingly, there is a continuing trend in the semiconductor industry to manufacture low-cost, high-performance, and low-power integrated circuits (ICs). These goals have been achieved in large part by scaling down the dimensions of semiconductor ICs and thus increasing device and circuit densities. Achieving higher densities calls for smaller feature sizes, smaller separations between features and layers, and more precise feature shapes. The scaling down of IC dimensions can facilitate faster circuit performance (e.g., faster switching speeds) and can lead to higher effective yield in IC fabrication processes by packing more circuits on a semiconductor die and/or more die on a semiconductor wafer. However, continued scaling also introduces considerable challenges. For example, as the minimum feature size of MOS devices has decreased, the OFF state leakage current has increased, and is rapidly approaching ON state current levels. In addition, transistor density is limited by the amount of area that is required between devices in order to electrically isolate them from each other.

Given such constraints, one method of increasing the density of transistors per unit area has been to stack transistors, as shown in FIG. 1. A MOS field-effect transistor (MOSFET) 102 is fabricated on a local substrate 104 over an inter-layer dielectric (ILD) 106, which isolates the MOSFET 102 from underlying IC devices, such as MOSFET 108. Vertical displacement, with electrical isolation provided by ILD 106, provides for an increased transistor packing density over a given area of substrate material. However, current methods of fabricating the local substrate 104, and for forming the diffused source/drain regions 110 of stacked MOSFET 102, require high-temperature processing. For example, the local substrate 104 can be formed by depositing amorphous silicon (a-Si) which is subsequently annealed at a very high temperature to recrystallize the a-Si. Similarly, formation of the source/drain regions 110 may be accomplished for example, by way of a high temperature dopant diffusion process. Such high temperature processes can lead to failures and degradation of circuitry and devices, for example due to electromigration or dopant redistribution, among others.

SUMMARY

The problems noted above are solved in large part by a method of forming a stacked low temperature transistor and related devices. At least some of the illustrative embodiments are methods comprising forming at least one integrated circuit device on a front surface of a bulk semiconductor substrate, and depositing an inter-layer dielectric on the at least one integrated circuit device. A semiconductor layer may then be deposited on the inter-layer dielectric. In some embodiments, a transistor is formed within the semiconductor layer. In some examples, the transistor includes a gate structure formed over the semiconductor layer as well as source/drain regions formed within the semiconductor layer disposed adjacent to and on either side of the gate structure. A metal layer may then be deposited over the transistor, after which an annealing process is performed to induce a reaction between the source/drain regions and the metal layer.

Other illustrative embodiments are methods comprising forming at least one integrated circuit device on a front surface of a bulk semiconductor substrate, and depositing an inter-layer dielectric on the at least one integrated circuit device. In some examples, a semiconductor layer is deposited on the inter-layer dielectric. A PMOS transistor may then be formed within the semiconductor layer. In various embodiments, the PMOS transistor includes a first gate structure formed over the semiconductor layer and a first source/drain region formed within the semiconductor layer disposed adjacent to and on either side of the first gate structure. Likewise, an NMOS transistor may be formed within the semiconductor layer adjacent to the PMOS transistor. By way of example, the NMOS transistor includes a second gate structure formed over the semiconductor layer and a second source/drain region formed within the semiconductor layer disposed adjacent to and on either side of the second gate structure. A first metal layer is deposited over the PMOS transistor, and a second metal layer is deposited over the NMOS transistor. In various embodiments, an annealing process is performed to induce simultaneous reactions between each of the first metal layer and the first source/drain region, and between the second metal layer and the second source/drain region.

Yet other illustrative embodiments are semiconductor devices comprising a bulk semiconductor substrate, at least one integrated circuit device on a front surface of the bulk semiconductor substrate, an inter-layer dielectric on the at least one integrated circuit device, a semiconductor layer on the inter-layer dielectric, and a transistor within the semiconductor layer. The transistor may include a gate structure on the semiconductor layer as well as source/drain regions formed within the semiconductor layer disposed adjacent to and on either side of the gate structure. A metal layer is deposited over the transistor, and the semiconductor device is annealed to induce a reaction between the source/drain regions and the metal layer.

The above summary contains simplifications, generalizations and omissions of detail and is not intended to be a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

For a more detailed description of the various embodiments, the detailed written description can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

The following discussion is directed to various embodiments which provide a method of forming a stacked low temperature transistor and related devices. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment. Also, layers and/or elements depicted herein are illustrated with particular dimensions and/or orientations relative to one another for purposes of simplicity and ease of understanding, and actual dimensions and/or orientations of the layers and/or elements may differ substantially from that illustrated herein.

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections. Unless otherwise stated, when a layer is said to be "deposited over the substrate" or "formed over the substrate", it means that the layer is deposited or formed over any topography that already exists on the substrate. Also, the term "thermal budget" is used to define an amount of thermal energy transferred to a semiconductor wafer (e.g., during a high-temperature process) and is given as a product of temperature (e.g., in degrees Kelvin) and time (e.g., in seconds). Low thermal budget processes are preferred, for example, to prevent dopant redistribution or electromigration.

Figure 1:
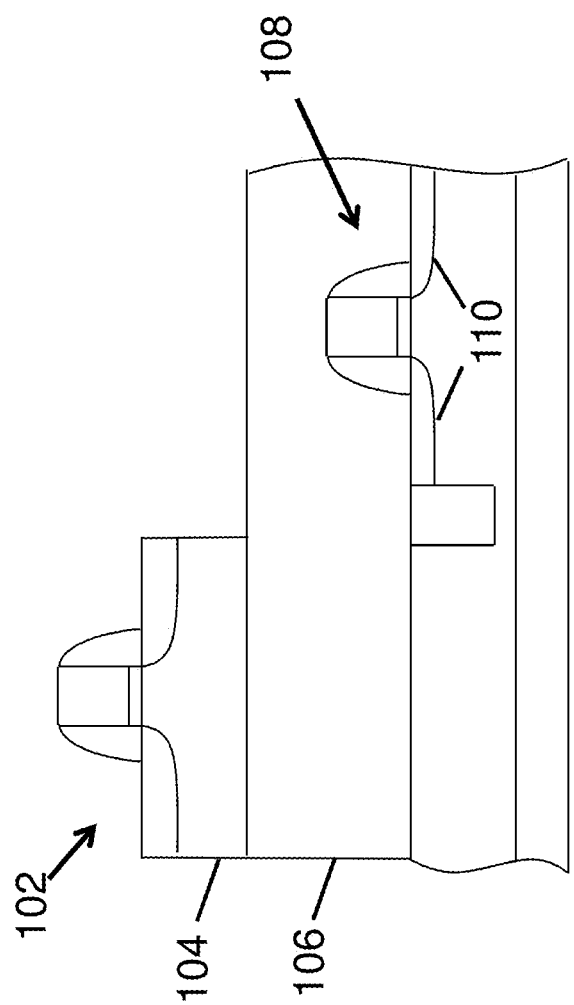
FIG. 1 shows a cross sectional view of stacked MOS devices electrically isolated from each other by an inter-layer dielectric.

The subject matter disclosed herein is directed to methods associated with formation of one or more stacked low temperature transistors over an IC device, such as a complementary metal-oxide-semiconductor (CMOS) device, a bipolar-CMOS (BiCMOS) device, an n-type MOS (NMOS) device, a p-type (PMOS) device. Other methods of transistor stacking have been reported, however existing approaches require high-temperature processing to fabricate the local substrate 104 as well as the diffused source/drain regions 110 of stacked MOSFET 102 (FIG. 1). Such high-temperature approaches greatly reduce their compatibility, in particular, for insertion into the back-end of existing CMOS process flows. For example, in some cases, it may be desirable to fabricate devices and/or circuitry on the back-end of a process flow rather than to fabricate a separate IC chip and subsequently bond the two IC chips, which can add significant cost, time and parasitic resistance. Thus, an improved method for forming a stacked low temperature transistor and related devices, as described with reference to FIGS. 2-19 is needed.

Figure 2:
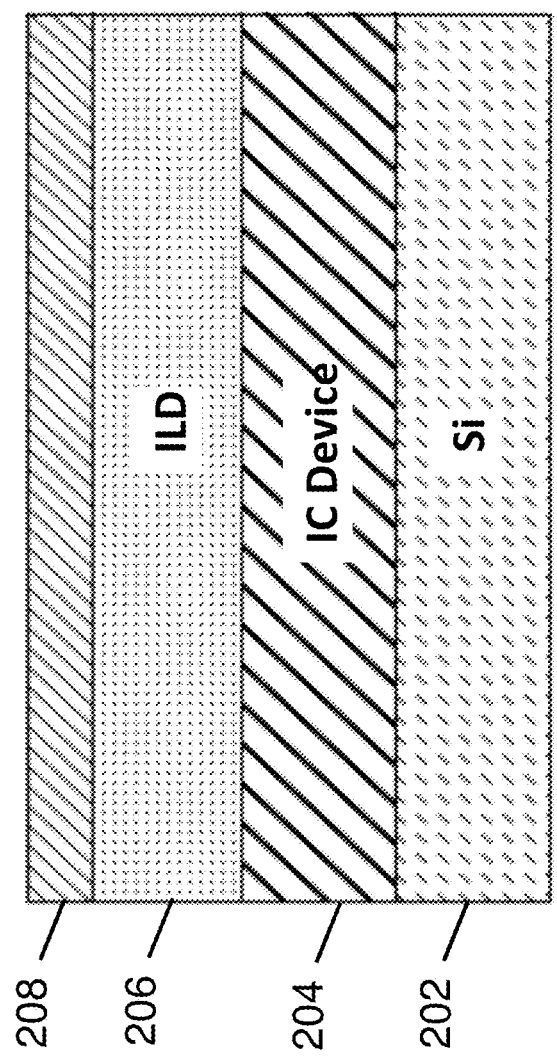
FIG. 2 shows a cross sectional view illustrating the formation of a stacked low temperature transistor after formation of a semiconductor layer.

Referring to FIG. 2, any of a plurality of IC devices are formed within an IC device layer 204 of the semiconductor substrate 202, in accordance with standard semiconductor processing techniques. The plurality of IC devices includes, in various embodiments, a CMOS device, a BiCMOS device, an NMOS device, and/or a PMOS device, among others. Further, the plurality of IC devices formed within the IC device layer 204 may collectively form one or more of a logic circuit, a central processing unit (CPU), a memory, a memory controller, an input/output (I/O) interface, a cache, a network interface, and/or subsystems of these devices/circuits. In various embodiments, the substrate 202 comprises a single crystal silicon (Si). In other embodiments, the substrate 202 comprises for example, a silicon germanium (SiGe) substrate, a germanium (Ge) substrate, or a silicon-on-insulator (SOI) substrate. In yet other embodiments, the substrate 202 comprises a silicon carbide (SiC) substrate, a gallium arsenide (GaAs) substrate, an indium arsenide (InAs) substrate, an indium gallium arsenide (InGaAs) substrate, an indium phosphide (InP), or another substrate as well known in the art.

A dielectric layer 206 is deposited over the IC device layer 204. The dielectric layer 206 may include an interlayer dielectric or a dielectric capping layer, among others. Depending on the material used for the dielectric layer 206, the dielectric layer 206 can be formed by a variety of techniques (e.g., thermal or plasma enhanced chemical vapor deposition (CVD), atomic layer deposition (ALD), or CVD oxide followed by CVD- or ALD-deposited silicon nitride). A semiconductor layer 208 is then formed over the dielectric layer 206. The semiconductor layer 208, as used herein, may be equivalently referred to as a semiconductor "thin-film". The semiconductor layer 208 may be formed by various techniques including ALD, CVD, metal-organic CVD (MOCVD), and physical vapor deposition (PVD), among others. In various embodiments, the semiconductor layer 208 comprises a layer selected from a group of layers including an amorphous silicon (a-Si) layer, a polycrystalline Si (poly-Si) layer, a single crystal Si layer, an amorphous silicon-germanium (a-SiGe) layer, a polycrystalline silicon germanium (poly-SiGe) layer, a single crystalline SiGe layer, an amorphous germanium (a-Ge) layer, a polycrystalline germanium (poly-Ge) layer, a single crystal Ge layer, an amorphous binary III-V layer, a polycrystalline binary III-V layer, a single crystalline binary III-V, an amorphous ternary III-V layer, a polycrystalline ternary III-V layer, a single crystalline ternary III-V layer, gallium nitride (GaN), and silicon carbide (SiC), as well as any combination of one or more of these films. In some embodiments, for example when the semiconductor layer 208 includes an amorphous or polycrystalline layer, a low-temperature anneal may be used to crystallize the semiconductor layer 208. The low-temperature anneal may include a laser annealing process or other low-temperature heat treatment, where the temperature may be chosen based on the composition of underlying layer materials, and where the temperature is less than the critical temperature of such underlying materials. For example, in some embodiments, if an underlying layer includes tungsten (W), the anneal temperature may be less than about 950 degrees Celsius. In other embodiments, if an underlying layer includes nickel silicide (NiSi), the anneal temperature may be less than about 600 degrees Celsius. In yet other embodiments, if an underlying layer includes aluminum (Al), the anneal temperature may be less than about 550 degrees Celsius. In some embodiments where an underlying layer includes copper (Cu), the anneal temperature may be less than about 400 degrees Celsius. Other anneal temperatures, based on various other underlying material types, will be apparent to those skilled in the art. In various embodiments, the semiconductor layer 208 includes a semiconductor layer having a thickness of about 50-5000 Angstroms. In some embodiments, the semiconductor layer 208 may also be doped with a dopant species (e.g., boron, phosphorous, arsenic).

Figure 3:
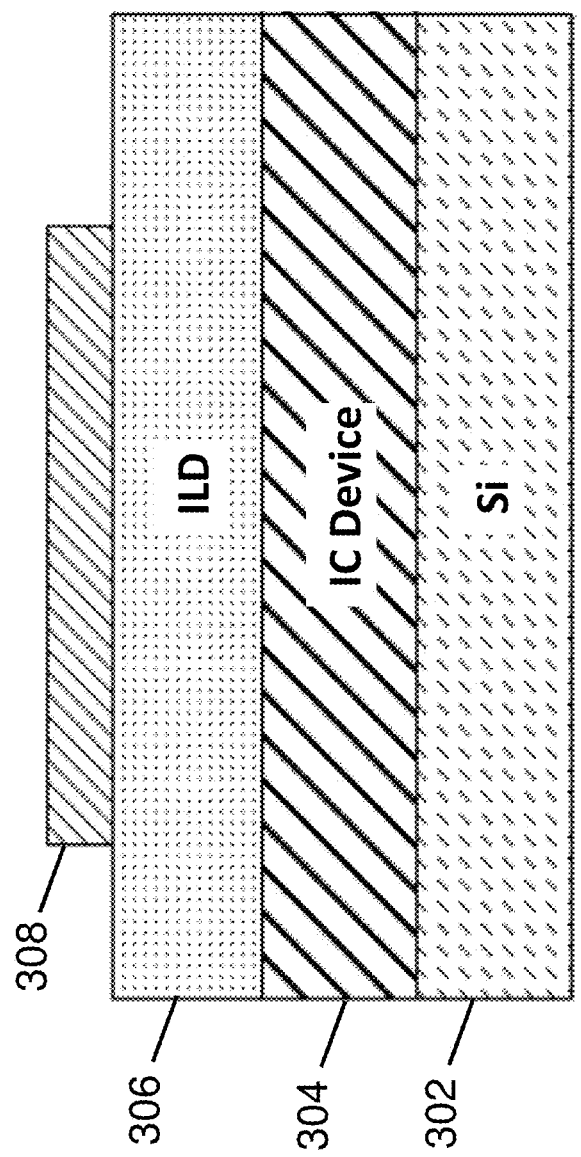
FIG. 3 shows a cross sectional view illustrating the formation of a stacked low temperature transistor after patterning of the semiconductor layer.

As shown in FIG. 3, the semiconductor layer 208 (FIG. 2) is then patterned and etched to form an active region 308. The patterning can be accomplished by way of a photolithographic process. In a photolithographic process, a patterned light sensitive layer can serve as a mask for an underlying layer or layers, wherein portions of the underlying layer or layers not protected by the light sensitive layer can be etched, ion implanted, or otherwise processed. In the example of FIG. 3, the regions of the semiconductor layer 208 (FIG. 2) which are not protected by the light sensitive layer are etched to form the active region 308. In some embodiments, etching the semiconductor layer to form the active region 308 includes forming a 2-D planar active region. In other embodiments, etching the semiconductor layer to form the active region 308 includes forming a 3-D fin-type active region, as discussed below with reference to FIG. 9.

It should also be noted that, at times, throughout the discussion herein, the same features and/or elements have been generally numbered in accordance with the corresponding figure number in which the feature and/or element appears. For example, semiconductor substrate 302 is substantially the same as the semiconductor substrate 202, IC device layer 304 is substantially the same as the IC device layer 204, dielectric layer 306 is substantially the same as the dielectric layer 206, etc. Other features and/or elements may be similarly numbered herein; however, such numbering does not necessarily imply a different element and/or feature than that which has been previously presented in a prior figure.

Figure 4:
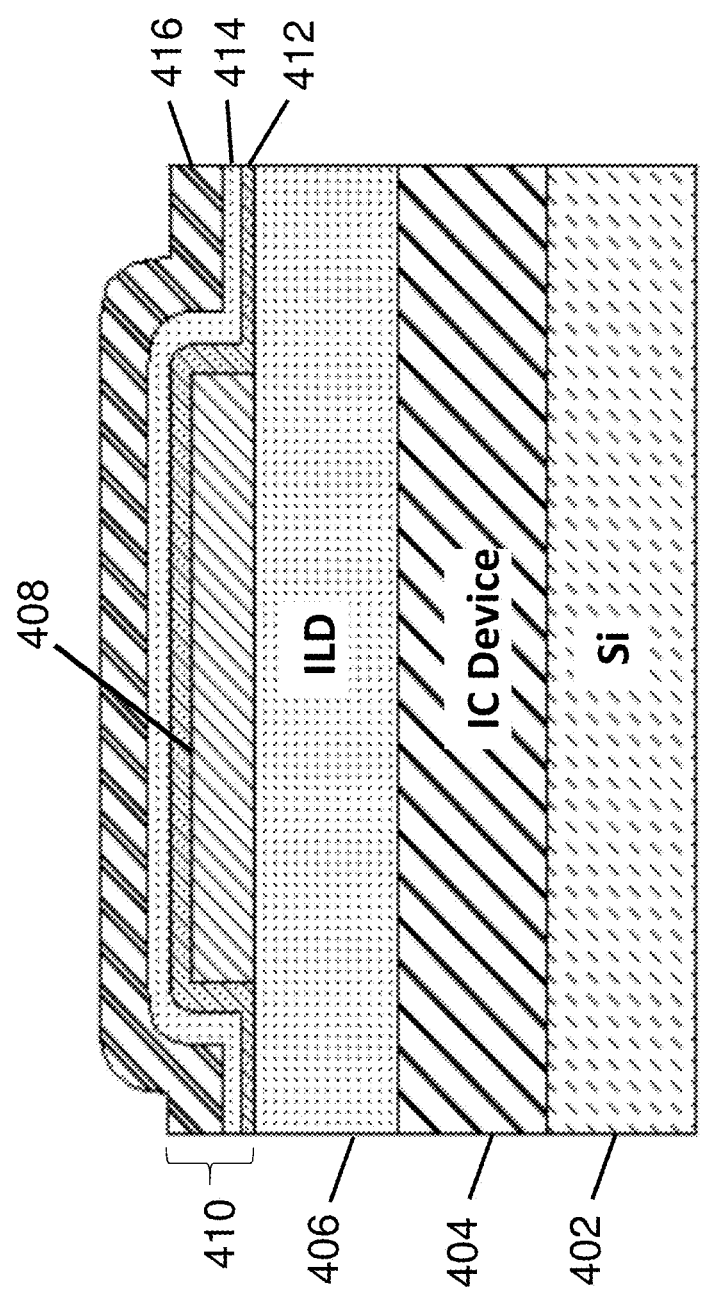
FIG. 4 shows a cross sectional view illustrating the formation of a stacked low temperature transistor after formation of a gate stack.

Referring to FIG. 4, a gate stack 410 is deposited over the active region 408 of the semiconductor layer, where the gate stack 410 includes a gate dielectric and a gate electrode. In various embodiments, the gate stack 410 includes a silicon dioxide layer, a silicon nitride layer, a high-K dielectric layer, a polycrystalline silicon layer, a doped polycrystalline silicon layer, a titanium nitride layer, a tantalum layer, a tantalum nitride layer, a tantalum silicon nitride layer, a tungsten layer, an aluminum layer, or any combination of these films. As an example, consider the illustration of FIG. 4, where the gate stack 410 includes a high-K dielectric 412, a metal gate film 414, and an in-situ doped polycrystalline silicon film 416. Depending on the materials used for the gate dielectric and gate electrode layers, the gate dielectric and gate electrode layers may be deposited by CVD, PVD, ALD, electron beam evaporation, or other well-known techniques.

Figure 5:
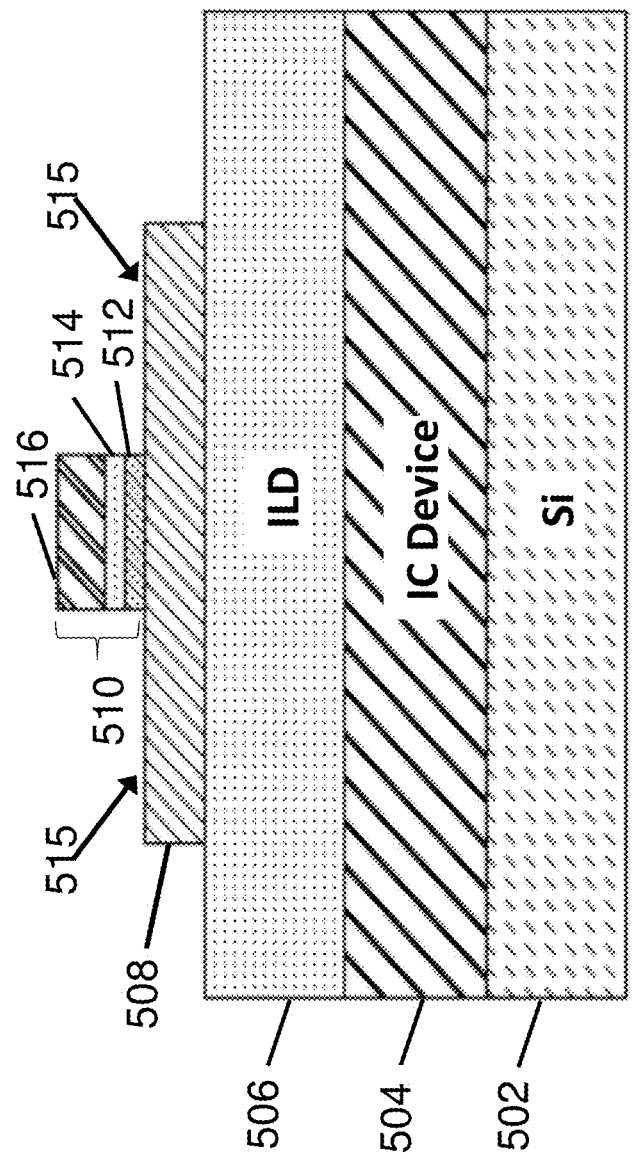
FIG. 5 shows a cross sectional view illustrating the formation of a stacked low temperature transistor after patterning of the gate stack.
Figure 6:
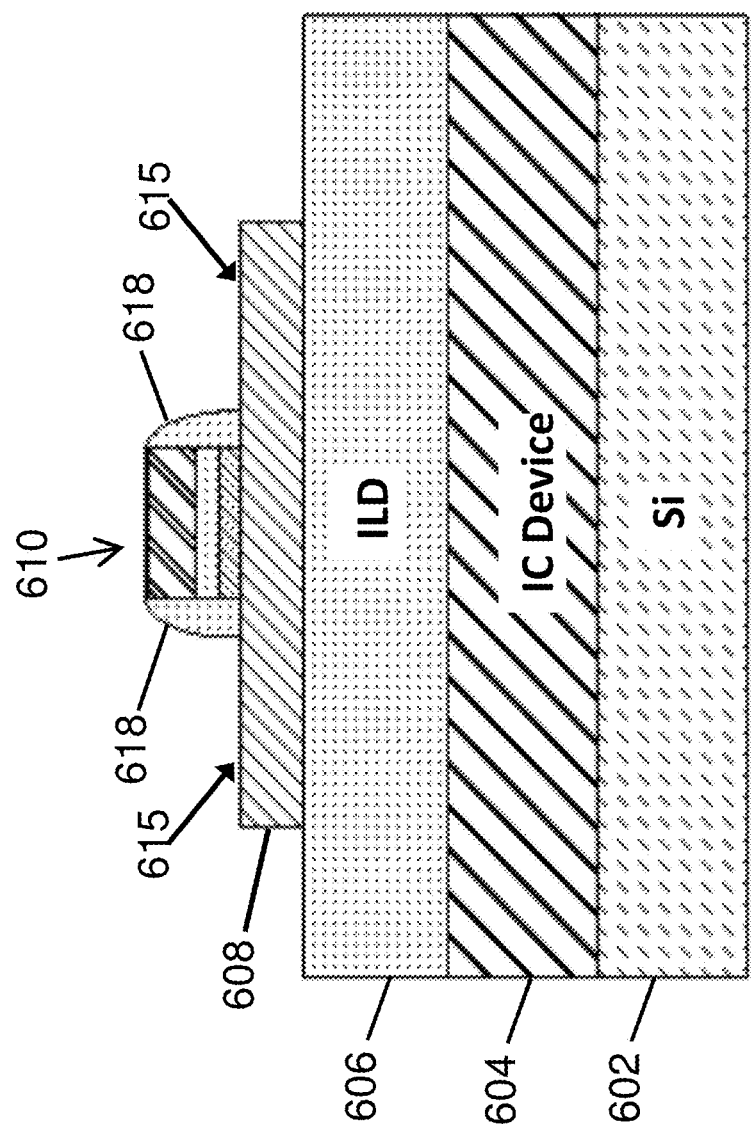
FIG. 6 shows a cross sectional view illustrating the formation of a stacked low temperature transistor after formation of a spacer.

A subsequent photolithographic process is used to pattern and etch the gate stack 410, where the patterned gate stack 510 is illustrated in FIG. 5. Various (dry or wet) etchants can be used to remove each of the layers in sequence, using the patterned light sensitive layer as a mask. In some embodiments, active region 508 is used as an etch stop layer during the gate stack etch. In other embodiments, the high-K dielectric 412 (FIG. 4) can be used as the etch stop layer. As shown in FIG. 5, source/drain regions 515 are defined within the semiconductor layer active region 508 and are disposed adjacent to and on either side of the patterned gate stack 510. Referring now to FIG. 6, after forming the patterned gate stack 610 and stripping the light sensitive layer, spacers 618 are formed on each sidewall of the gate stack 610. Each of the spacers 618 comprises an insulating material such as an oxide and/or nitride based material. In some embodiments, the spacers 618 comprise a bis t-ButylaminoSilane (BTBAS) silicon nitride layer. The spacers 618 are formed by depositing one or more layers of such material(s) over the substrate 602 in a conformal manner, followed by an anisotropic etch thereof, thereby removing spacer material from the top of the gate stack 610 and the substrate 602, while leaving the spacers 618 on each of the sidewalls of the gate stack 610.

Figure 7:
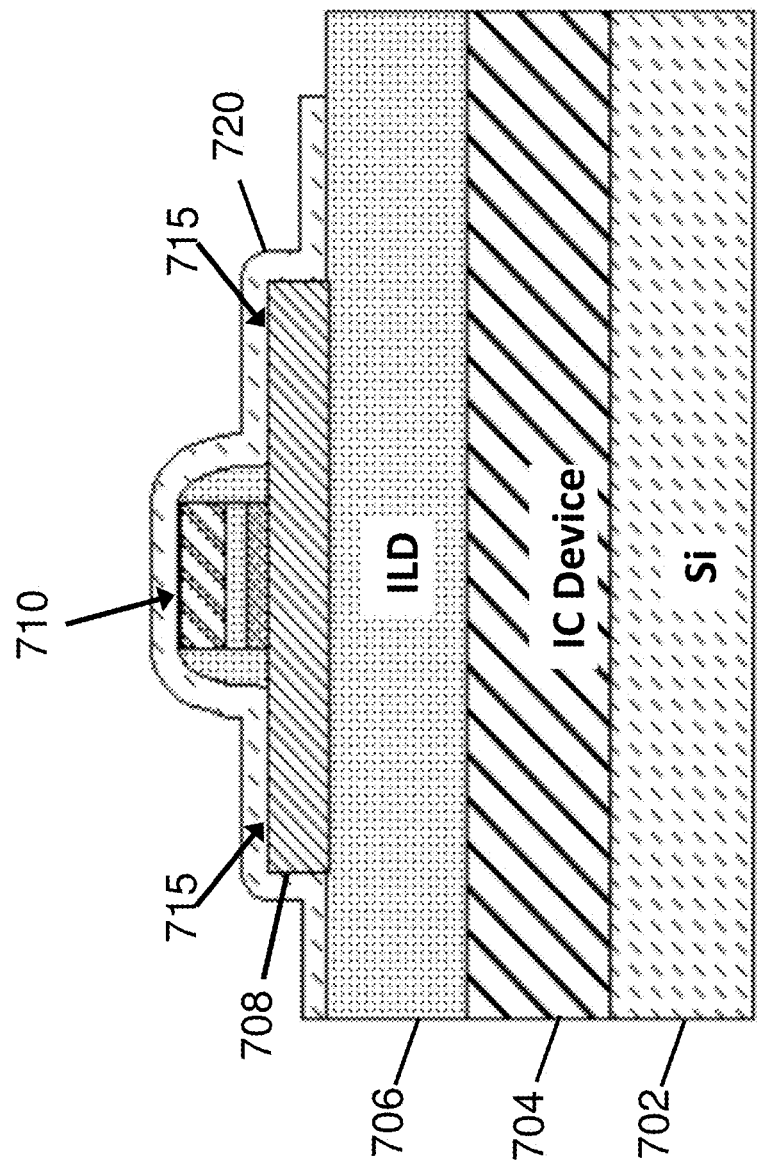
FIG. 7 shows a cross sectional view illustrating the formation of a stacked low temperature transistor after formation of a metal layer to serve as a precursor to silicidation of a source and a drain region.

Thereafter, as shown in FIG. 7, a metal layer 720 is deposited over the substrate 702. Depending on the type of transistor being formed (N-type or P-type), the metal layer 720 may comprise any of a plurality of metals. For PMOS device fabrication, the metal layer 720 may include platinum (Pt) or nickel (Ni), and for NMOS device fabrication, the metal layer 720 may include erbium (Er), ytterbium (Yb), or palladium (Pd). In various embodiments, the metal layer 720 is deposited by PVD, ALD, or e-beam evaporation, among others, and the metal layer 720 has a thickness of about 50-5000 Angstroms. The metal layer 720 serves as a precursor to silicidation of the source/drain regions 715 within a semiconductor layer 708 disposed adjacent to and on either side of the gate stack 710. The semiconductor layer 708, as used herein, may be equivalently referred to as a semiconductor "thin-film".

Figure 8:
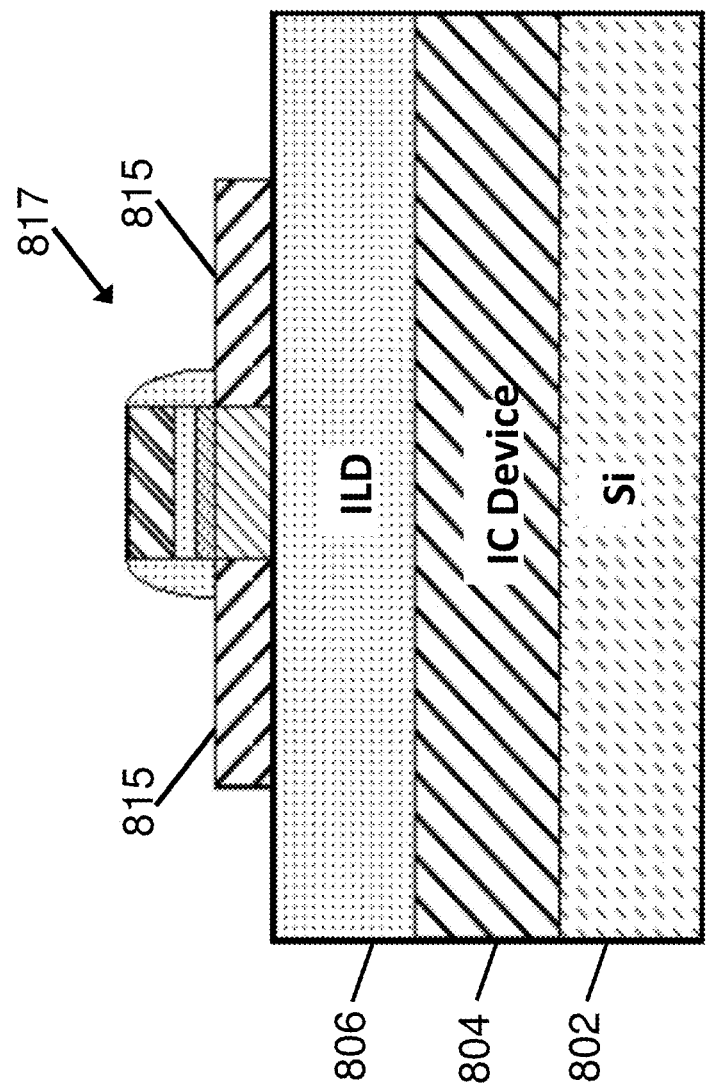
FIG. 8 shows a cross sectional view illustrating the formation of a stacked low temperature transistor after silicidation of the source and drain regions.

After formation of the metal layer 720, a low-temperature anneal at about 300-400 degrees Celsius is performed to induce a reaction between the metal layer 720 and the semiconductor layer 708. As shown in FIG. 8, the reaction between the metal and the semiconductor layer forms a silicide layer, such as silicided source/drain regions 815, and complete the formation of a stacked low temperature transistor 817. Depending on the type of metal used for the metal layer 720 (FIG. 7), the silicide layer which forms the silicided source/drain regions 815 may include a platinum silicide (PtSi) layer, a nickel silicide (NiSi) layer, an erbium silicide (ErSi) layer, an ytterbium silicide (YbSi) layer, or a palladium silicide (PdSi) layer, among others. Unreacted metal is removed, for example, by way of a wet chemical etch. The thermal budget used to induce the reaction between the metal layer 720 (FIG. 7) and the semiconductor layer 708 (FIG. 7) and thus form the silicided source/drain regions 815 is low as compared to, for example, the thermal budget used for formation of the underlying plurality of IC devices within the IC device layer 804. Thus, formation of the stacked low temperature transistor 817 can be performed as a back-end process after higher thermal budget processing is complete and without degradation of the underlying plurality of IC devices within the IC device layer 804, for example, due to electromigration or dopant redistribution.

Figure 9:
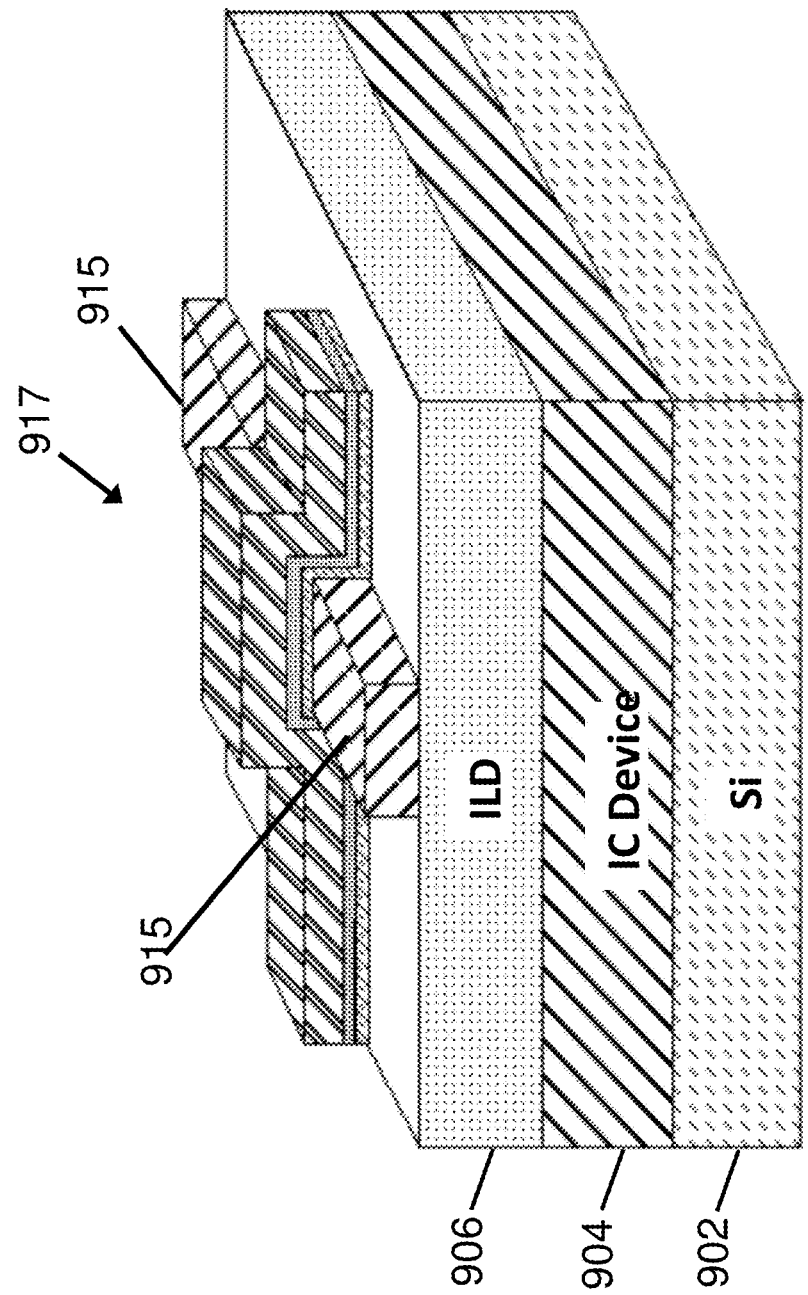
FIG. 9 shows a cross sectional view illustrating the formation of a multi-gate low temperature FinFET device.

FIG. 9 illustrates an alternative embodiment, where a completed stacked low temperature transistor includes a multi-gate FinFET device 917. The FinFET device 917 can be formed, for example, by etching the semiconductor layer to form a 3-D fin-type active region, as discussed above with reference to FIG. 3. The FinFET device 917 includes silicided source/drain regions 915, which are formed by a low thermal budget process in order to avoid degradation of the underlying plurality of IC devices within the IC device layer 904.

Figure 10:
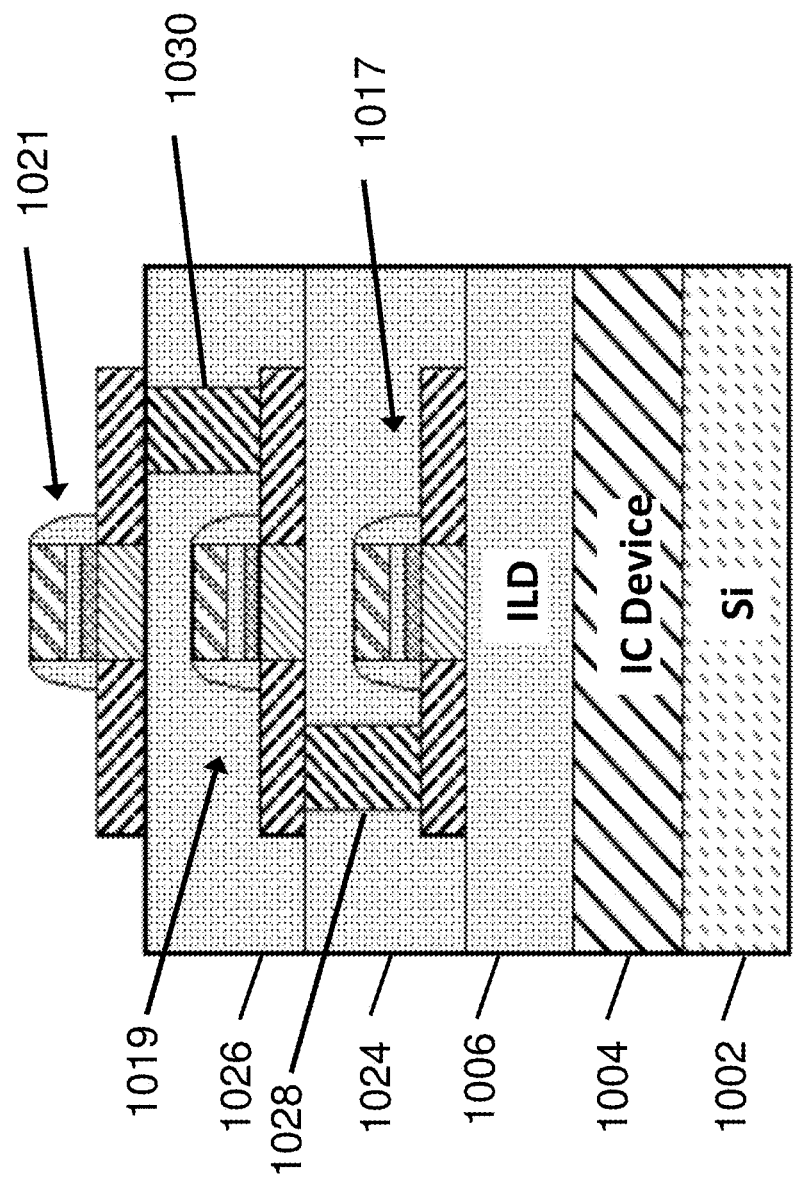
FIG. 10 shows a cross sectional view illustrating the formation of a plurality of stacked low temperature transistors.

FIG. 10 illustrates at least one IC device monolithically integrated with a plurality of stacked low temperature transistors 1017, 1019, 1021, in accordance with some embodiments. While three stacked low temperature transistors are shown by way of example in FIG. 10, it should be understood that any number of low temperature transistors may be stacked. In some embodiments, each of the low temperature transistors 1017, 1019, 1021 are formed in a similar manner as the low temperature transistor 817 (FIG. 8) or the low temperature transistor 917 (FIG. 9). As shown in FIG. 10, dielectric layers, such as ILD layers 1024, 1026 provide for electrical isolation between each of the stacked transistors. Stacking of the low temperature transistors 1017, 1019, 1021 can be used to increase the functionality of the IC chip without increasing its form factor and without using additional semiconductor real estate area. Moreover, one or more of the low temperature transistors 1017, 1019, 1021 may be electrically coupled to each other in order to provide a higher ON-state current, for example by way of vertical electrical connections (VIAs) 1028, 1030 as compared to the ON-state current provided by a single low temperature stacked transistor.

Figure 11:
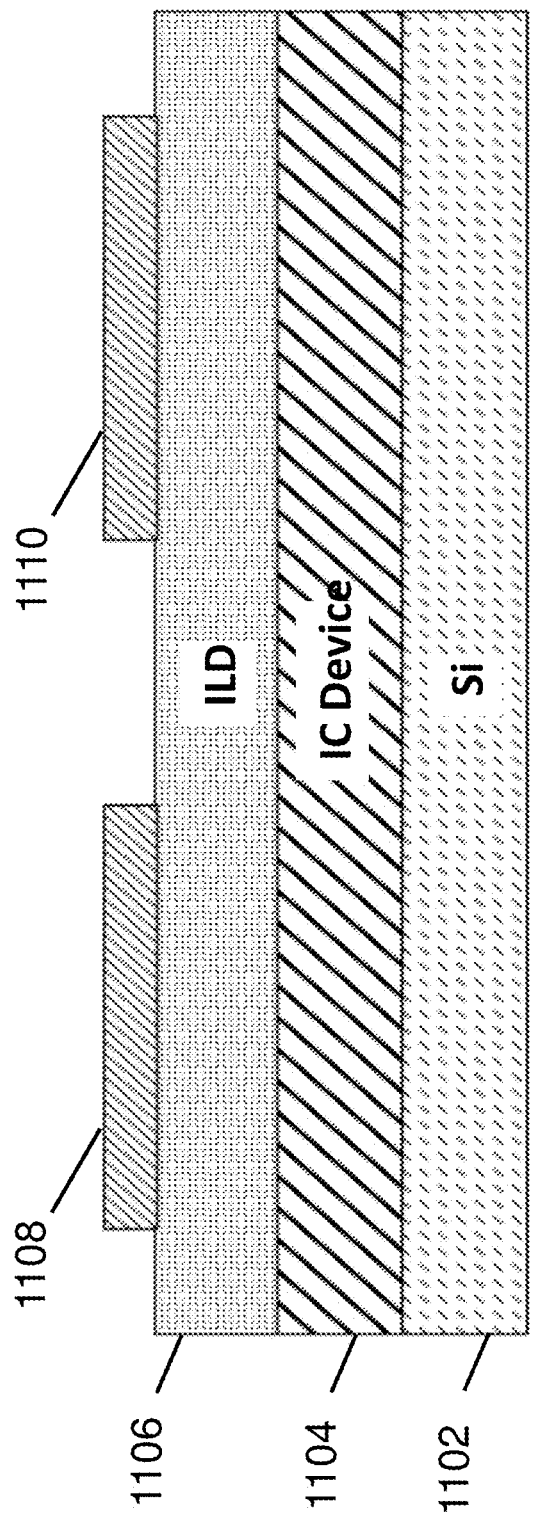
FIG. 11 shows a cross sectional view illustrating the formation of a stacked low temperature CMOS device after patterning a plurality of active regions.

In some alternative embodiments, as shown in FIG. 11, the semiconductor layer 208 (FIG. 2) is patterned and etched to form a plurality of active regions 1108, 1110. In various embodiments, the plurality of active regions 1108, 1110 are formed in order to fabricate a complementary MOS (CMOS) device structure, as described in more detail below with reference to FIGS. 12-19. The patterning can be accomplished by way of a photolithographic process as previously described. In some embodiments, etching the semiconductor layer to form the plurality of active regions 1108, 1110 includes forming 2-D planar active regions. In other embodiments, etching the semiconductor layer to form the active regions 1108, 1110 includes forming 3-D fin-type active regions.

Figure 12:
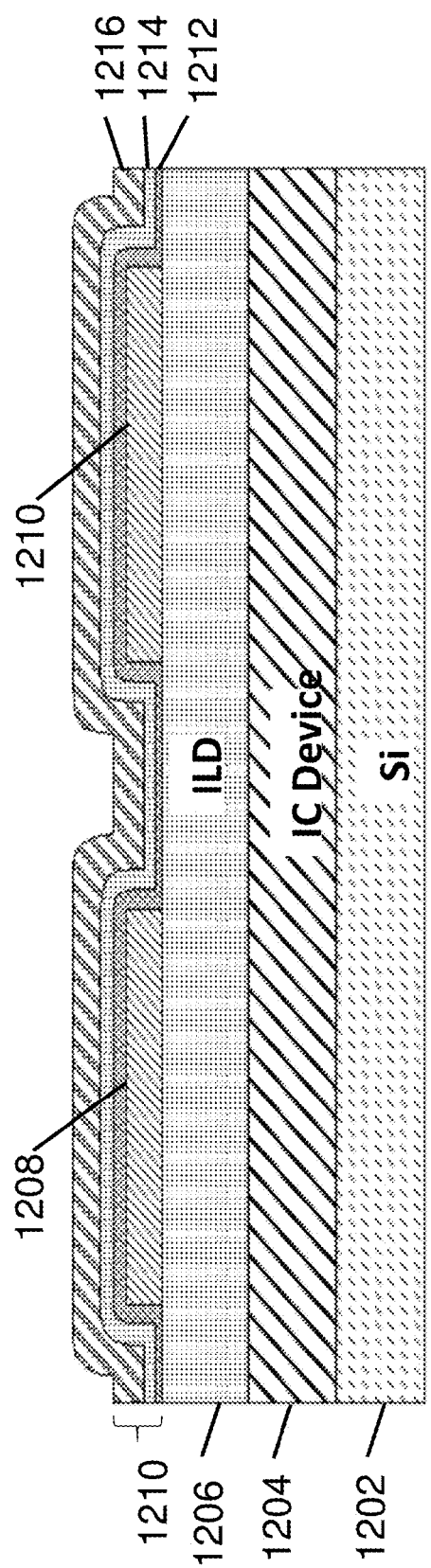
FIG. 12 shows a cross sectional view illustrating the formation of a stacked low temperature CMOS device after formation of the gate stack.

Referring to FIG. 12, a gate stack 1210 is deposited over the plurality of active regions 1208, 1210 of the semiconductor layer, where the gate stack 1210 includes a gate dielectric and a gate electrode. In various embodiments, the gate stack 1210 includes a silicon dioxide layer, a silicon nitride layer, a high-K dielectric layer, a polycrystalline silicon layer, a doped polycrystalline silicon layer, a titanium nitride layer, a tantalum layer, a tantalum nitride layer, a tantalum silicon nitride layer, a tungsten layer, an aluminum layer, or any combination of these films. As an example, consider the illustration of FIG. 12, where the gate stack 1210 includes a high-K dielectric 1212, a metal gate film 1214, and an in-situ doped polycrystalline silicon film 1216. Depending on the materials used for the gate dielectric and gate electrode layers, the gate dielectric and gate electrode layers may be deposited by CVD, PVD, ALD, electron beam evaporation, or other well-known techniques.

Figure 13:
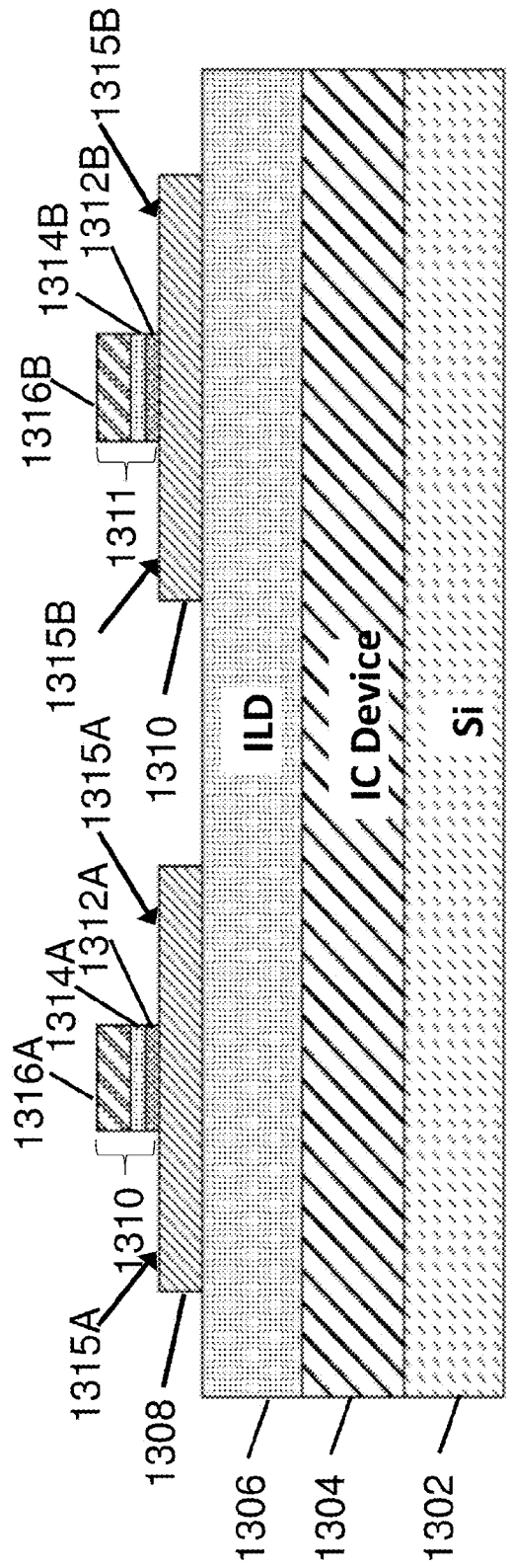
FIG. 13 shows a cross sectional view illustrating the formation of a stacked low temperature CMOS device after patterning of the gate stack.
Figure 14:
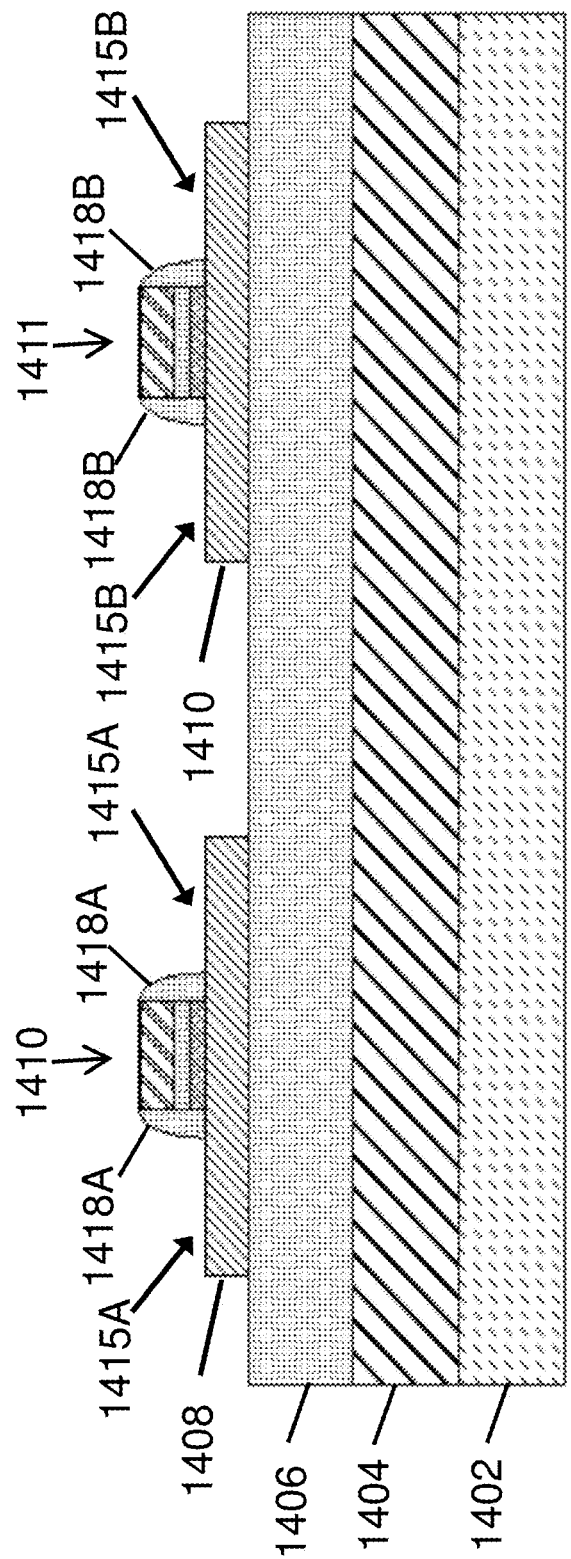
FIG. 14 shows a cross sectional view illustrating the formation of a stacked low temperature CMOS device after formation of spacers.

A subsequent photolithographic process is used to pattern and etch the gate stack 1210 for each transistor, where the plurality of patterned gate stacks 1310, 1311 is illustrated in FIG. 13. As shown, patterned gate stack 1310 includes a high-K dielectric 1312A, a metal gate film 1314A, and an in-situ doped polycrystalline silicon film 1316A. Similarly, patterned gate stack 1311 includes a high-K dielectric 1312B, a metal gate film 1314B, and an in-situ doped polycrystalline silicon film 1316B. As shown in FIG. 13, source/drain regions 1315A are defined within the semiconductor layer active region 1308 and are disposed adjacent to and on either side of the patterned gate stack 1310. Likewise, source/drain regions 1315B are defined within the semiconductor layer active region 1310 and are disposed adjacent to and on either side of the patterned gate stack 1311. Referring now to FIG. 14, after forming the plurality of patterned gate stacks 1410, 1411, spacers 1418A/1418B are formed on each sidewall of the plurality of patterned gate stacks 1410, 1411. In some embodiments, the spacers 1418A/1418B comprise an insulating material such as an oxide and/or nitride based material. In other embodiments, the spacers 1418A/1418B comprise a BTBAS silicon nitride layer.

Figure 15:
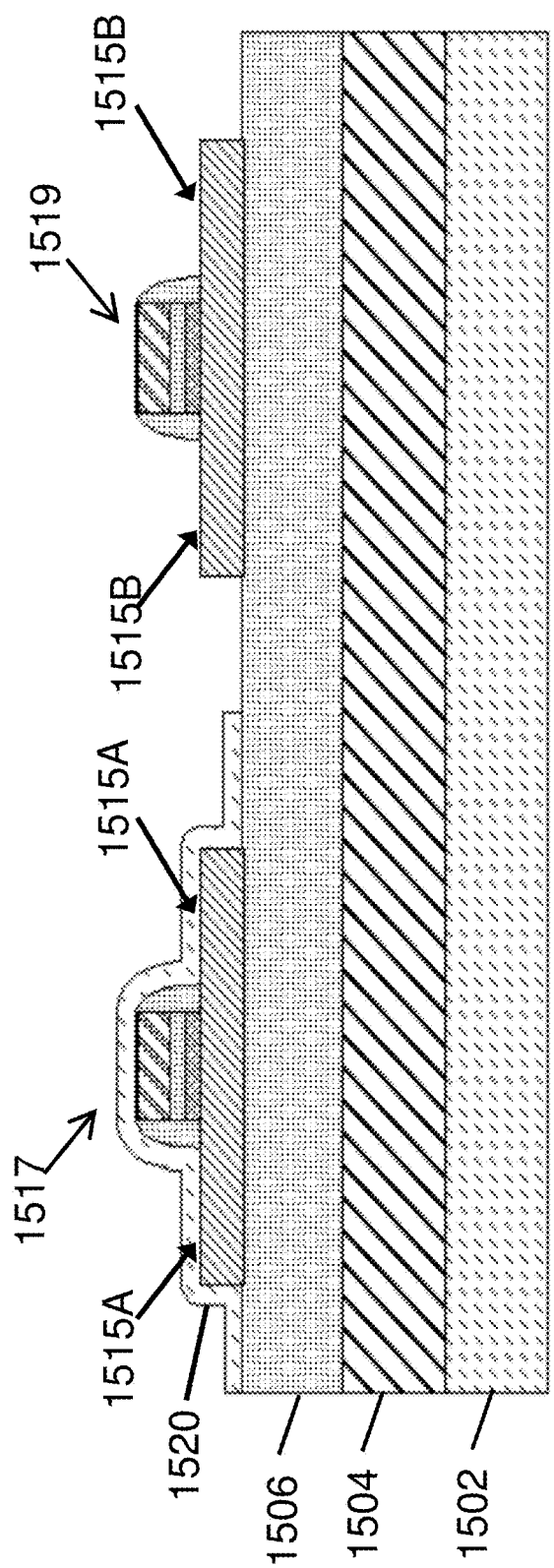
FIG. 15 shows a cross sectional view illustrating the formation of a stacked low temperature CMOS device after formation of a first metal layer to serve as a precursor to silicidation of a PMOS source and a drain region.
Figure 16:
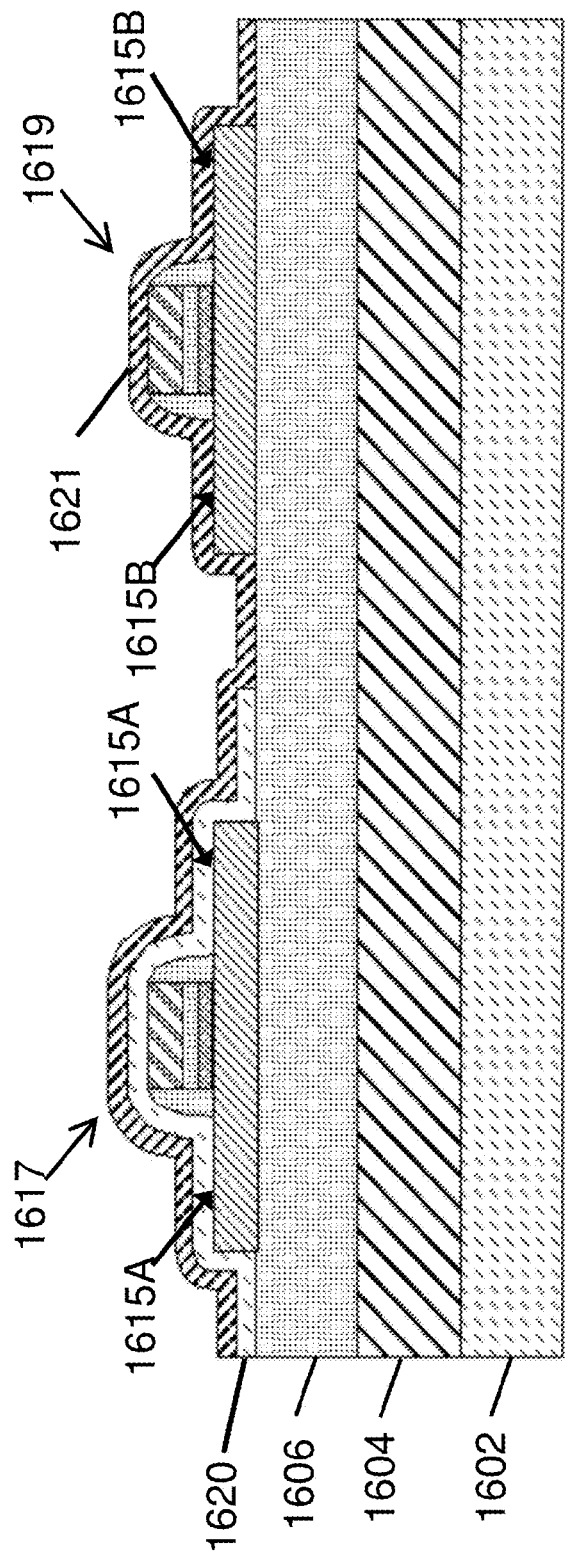
FIG. 16 shows a cross sectional view illustrating the formation of a stacked low temperature CMOS device after formation of a second metal layer to serve as a precursor to silicidation of an NMOS source and a drain region.

Thereafter, as shown in FIG. 15, a metal layer 1520 is deposited over the substrate 1502. In some embodiments, to enable fabrication of a PMOS transistor 1517, the metal layer 1520 comprises Pt or nickel Ni. The metal layer 1520 can subsequently be patterned and removed (e.g., by etching) from over NMOS transistor 1519. Thereafter, as shown in FIG. 16, metal layer 1621 may be deposited over the substrate 1602. To enable fabrication of the NMOS transistor 1619, the metal layer 1621 may include Er, Yb, or Pd. In various embodiments, each of the metal layers 1620, 1621 is deposited by PVD, ALD, or e-beam evaporation, among others. In some embodiments, the metal layers 1620, 1621 each have a thickness of about 50-5000 Angstroms. The metal layer 1620 serves as a precursor to silicidation of the source/drain region 1615A, and the metal layer 1621 serves as a precursor to silicidation of the source/drain region 1615B.

Figure 17:
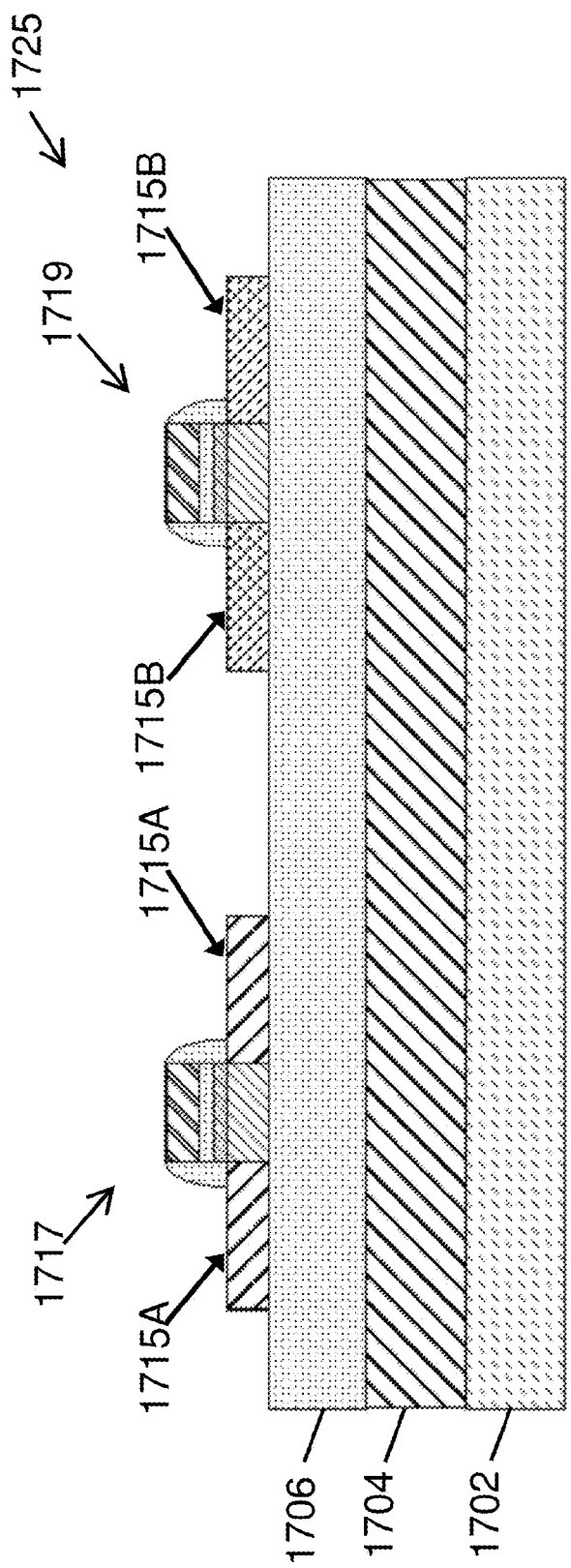
FIG. 17 shows a cross sectional view illustrating the formation of a stacked low temperature CMOS device after silicidation of the NMOS and PMOS source and drain regions.

After formation of the metal layers 1620, 1621 a low-temperature anneal at about 300-400 degrees Celsius is performed. As shown in FIG. 17, the anneal serves to form silicide layers in each of the PMOS transistor 1717 and the NMOS transistor 1719. In the example of FIG. 17, formation of silicided source/drain regions 1715A serve to complete the fabrication of the stacked low temperature PMOS transistor 1717. In a similar manner, formation of silicided source/drain regions 1715B serve to complete the fabrication of the stacked low temperature NMOS transistor 1719. Moreover, fabrication of the PMOS transistor 1717 and the NMOS transistor 1719 serve to complete fabrication of a stacked low temperature CMOS device 1725. After silicidation, unreacted metal can be removed, for example, by way of a wet chemical etch. The thermal budget used to form each of the silicided source/drain regions 1715A, 1715B is low as compared to, for example, the thermal budget used for formation of the underlying plurality of IC devices within the IC device layer 1704. Thus, formation of the stacked low temperature CMOS device 1725 can be performed as a back-end process after higher thermal budget processing is complete and without degradation of the underlying plurality of IC devices within the IC device layer 1704, for example, due to electromigration or dopant redistribution.

Figure 18:
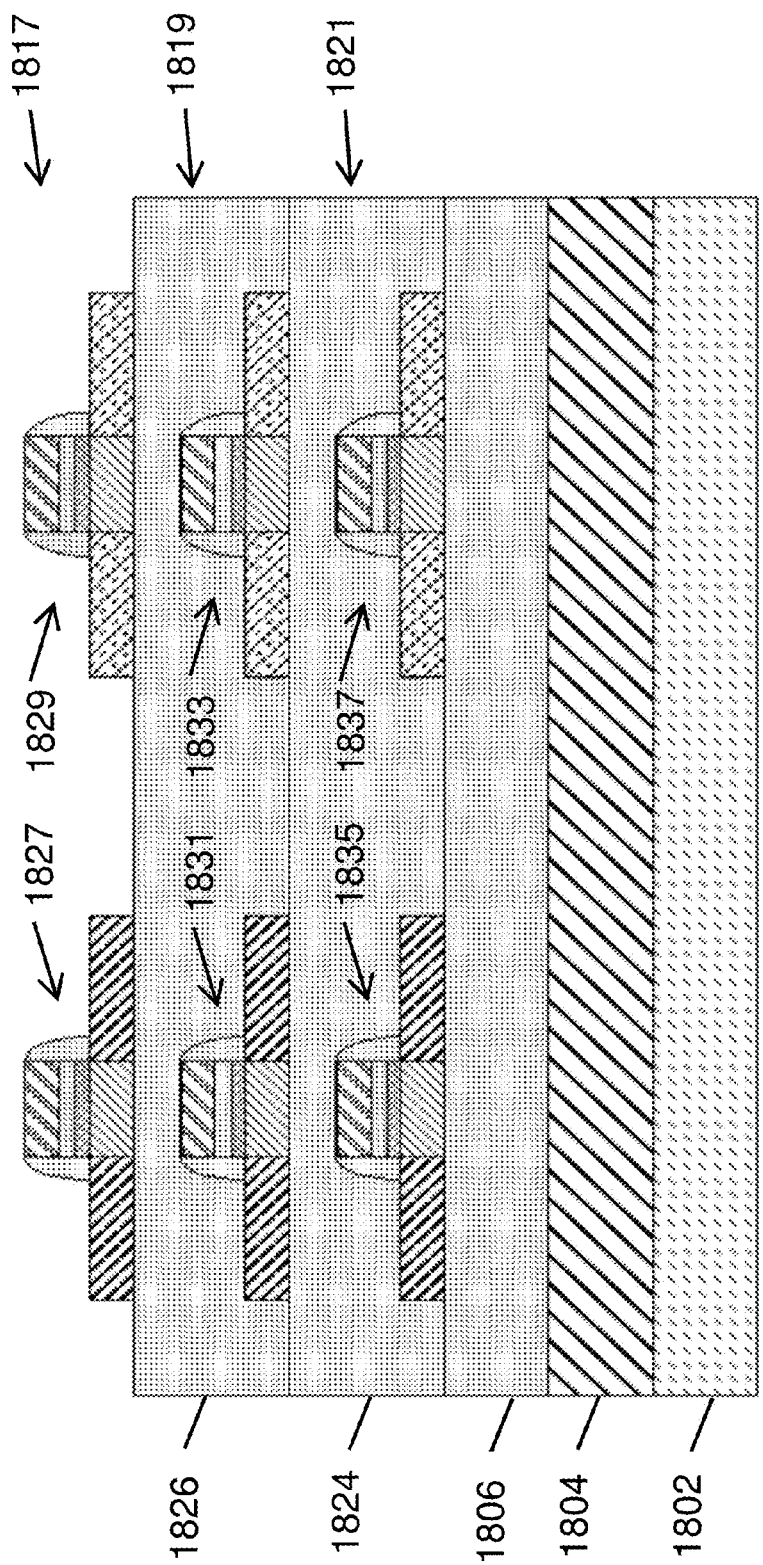
FIG. 18 shows a cross sectional view illustrating the formation of a plurality of stacked low temperature CMOS devices.

FIG. 18 illustrates at least one IC device monolithically integrated with a plurality of stacked CMOS devices 1817, 1819, 1821, in accordance with some embodiments. As shown, CMOS device 1817 includes PMOS transistor 1827 and NMOS transistor 1829, CMOS device 1819 includes PMOS transistor 1831 and NMOS transistor 1833, and CMOS device 1821 includes PMOS transistor 1835 and NMOS transistor 1837. While three stacked low temperature CMOS devices are shown by way of example in FIG. 18, it should be understood that any number of low temperature CMOS devices may be stacked. In some embodiments, each of the low temperature CMOS devices 1817, 1819, 1821 are formed in a similar manner as the low temperature CMOS device 1725 (FIG. 17). In other embodiments, each of the low temperature CMOS devices 1817, 1819, 1821 are formed using FinFET devices, such as the shown in FIG. 9. As shown in FIG. 18, dielectric layers, such as ILD layers 1824, 1826 provide for electrical isolation between each of the stacked CMOS devices. Stacking of the low temperature CMOS devices 1817, 1819, 1821 can be used to preserve valuable semiconductor real estate area. Moreover, one or more of the low temperature CMOS devices 1817, 1819, 1821 may be electrically coupled to each other, for example, by way of VIAs (not shown).

Figure 19:
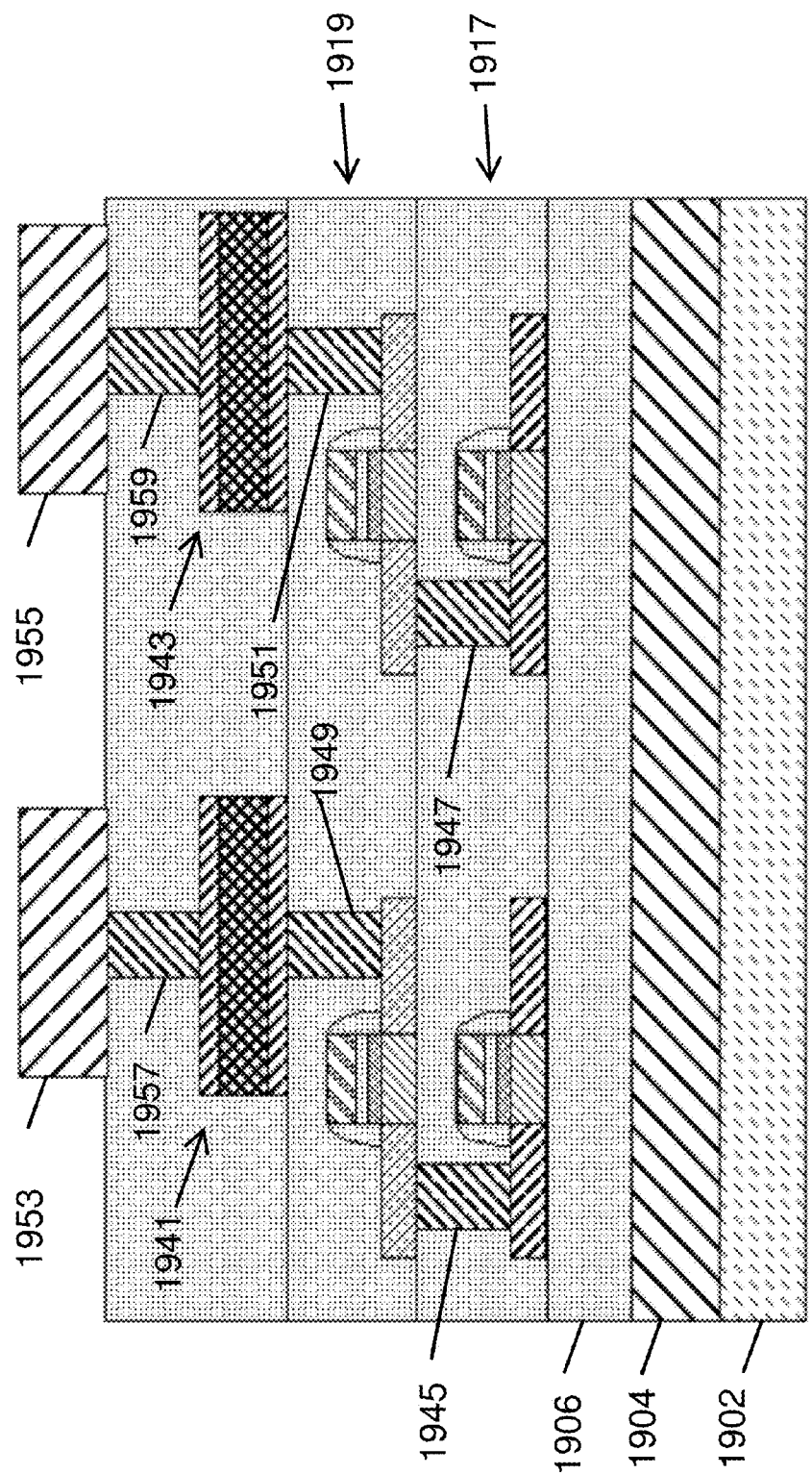
FIG. 19 shows a cross sectional view illustrating the formation of a plurality of stacked low temperature CMOS devices integrated with a plurality of memory cells.

FIG. 19 illustrates at least one IC device monolithically integrated with a plurality of stacked CMOS devices 1917, 1919 and with a plurality of memory cells 1941, 1943, in accordance with some embodiments. The CMOS devices 1917, 1919 and the plurality of memory cells 1941, 1943 may be electrically coupled by way of VIAs 1945, 1947, 1949, 1951. Further, the plurality of memory cells 1941, 1943 may be electrically coupled to metal interconnects 1953, 1955 by way of VIAs 1957, 1959. In various embodiments, CMOS devices 1917, 1919 may be used as memory driver devices to drive one or more memory cells of the plurality of memory cells 1941, 1943. In other embodiments, CMOS devices 1917, 1919 may be used as memory selector devices to select one or more memory cells of the plurality of memory cells 1941, 1943. Additionally, the memory cells 1941, 1943 may comprise one or more of a plurality of various types of memory cells, including ferroelectric random access memory (FeRAM), magnetic RAM (MRAM), Resistive RAM (RRAM), and phase-change RAM (PCRAM), among others. In other embodiments, one or more of the plurality of stacked CMOS devices 1917, 1919 may also be electrically coupled to one or more sensors, or other active and/or passive devices.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

Furthermore, while the above discussion is meant to be illustrative of the principles and various embodiments of the present invention, numerous variations and modifications will become apparent to those skilled in the art once the above disclosure is fully appreciated. For example, unless otherwise indicated, any one or more of the layers set forth herein can be formed in any number of suitable ways (e.g., with spin-on techniques, sputtering techniques (e.g., magnetron and/or ion beam sputtering), thermal growth techniques, deposition techniques such as chemical vapor deposition (CVD), physical vapor deposition (PVD) and/or plasma enhanced chemical vapor deposition (PECVD), or atomic layer deposition (ALD)). Also, unless otherwise indicated, any one or more of the layers can be patterned in any suitable manner (e.g., via lithographic and/or etching techniques). It is intended that the following claims be interpreted to embrace all such variations and modifications.

What is claimed is:
1. A method comprising:
   forming at least one integrated circuit device on a front surface of a bulk semiconductor substrate;
   depositing an inter-layer dielectric on the at least one integrated circuit device;
   depositing a semiconductor layer on the inter-layer dielectric;
   forming a gate structure of a transistor over a first portion of the semiconductor layer;

depositing a metal layer over the gate structure and over a second portion of the semiconductor layer adjacent to and on either side of the gate structure; and annealing to induce a reaction between the second portion of the semiconductor layer and the metal layer, wherein the annealing forms silicide layers adjacent to and on either side of the first portion of the semiconductor layer, and wherein the silicide layers substantially define source/drain regions of the transistor.

2. The method of claim 1, wherein the annealing to induce the reaction includes thermal processing at a temperature of less than about 600 degrees Celsius.

3. The method of claim 1, wherein the annealing to induce the reaction includes laser annealing at a temperature of less than about 600 degrees Celsius.

4. The method of claim 1, further comprising removing unreacted metal of the metal layer.

5. The method of claim 1, further comprising:
patterning the semiconductor layer; and
etching the semiconductor layer to form an active region including an active region selected from a group comprising: a 2-D planar active region; and a 3-D fin-type active region.

6. The method of claim 5, further comprising:
depositing a gate stack over the patterned and etched semiconductor layer;
patterning the gate stack; and
etching the gate stack to form the gate structure.

7. The method of claim 6, wherein the gate stack includes at least one of a high-K dielectric layer, a gate metal layer over the high-K dielectric layer, and a doped polycrystalline silicon layer over the gate metal layer.

8. The method of claim 1, further comprising prior to annealing, implanting a dopant species into the semiconductor layer.

9. The method of claim 1, further comprising after annealing, implanting a dopant species into the semiconductor layer.

10. The method of claim 1, wherein the transistor includes a PMOS transistor, and wherein the depositing the metal layer includes depositing one of a platinum layer and a nickel layer.

11. The method of claim 1, wherein the transistor includes an NMOS transistor, and wherein the depositing the metal layer includes depositing one of an erbium layer, an ytterbium layer, and a palladium layer.

12. A method comprising:
forming at least one integrated circuit device on a front surface of a bulk semiconductor substrate;
depositing an inter-layer dielectric on the at least one integrated circuit device;
depositing a semiconductor layer on the inter-layer dielectric;
forming a PMOS transistor including a first gate structure over a first portion of the semiconductor layer, wherein the PMOS transistor includes first semiconductor layer regions disposed adjacent to and on either side of the first gate structure;
forming an NMOS transistor adjacent to the PMOS transistor, wherein the NMOS transistor includes a second gate structure over a second portion of the semiconductor layer, and wherein the NMOS transistor includes second semiconductor layer regions disposed adjacent to and on either side of the second gate structure;
depositing a first metal layer over the PMOS transistor;
depositing a second metal layer over the NMOS transistor; and
annealing to induce a simultaneous reaction between each of the first metal layer and the first semiconductor layer regions, and between the second metal layer and the second semiconductor layer regions.

13. The method of claim 12, wherein the annealing forms first silicide layers adjacent to and on either side of the first portion of the semiconductor layer and second silicide layers adjacent to and on either side of the second portion of the semiconductor layer, wherein the first silicide layers substantially define source/drain regions of the PMOS transistor, and wherein the second silicide layers substantially define source/drain regions of the NMOS transistor.

14. The method of claim 13, wherein the first silicide layers have a first thickness that is substantially the same as a thickness of the first portion of the semiconductor layer and the second silicide layers have a second thickness that is substantially the same as a thickness of the second portion of the semiconductor layer.

15. The method of claim 12, further comprising:
depositing the first metal layer over both the PMOS and NMOS transistors;
patterning the first metal layer;
etching the first metal layer to remove the first metal layer over the NMOS transistor;
depositing the second metal layer over both the PMOS and NMOS transistors;
patterning the second metal layer; and
etching the second metal layer to remove the second metal layer over the PMOS transistor.

16. The method of claim 12, wherein depositing the first metal layer includes depositing one of a platinum layer and a nickel layer.

17. The method of claim 12, wherein depositing the second metal layer includes depositing one of an erbium layer, an ytterbium layer, and a palladium layer.

18. A method comprising:
forming at least one integrated circuit (IC) device disposed within an IC device layer of a semiconductor substrate;
depositing a first dielectric layer over the IC device layer; and
forming a first transistor on the first dielectric layer, wherein the forming the first transistor includes:
depositing a first semiconductor region directly on the first dielectric layer;
forming a first gate structure over the first semiconductor region; and
forming first silicide layers disposed adjacent to and on either side of the first semiconductor region, wherein the first silicide layers have a thickness, and wherein the thickness of the first silicide layers defines source/drain regions of the first transistor.

19. The method of claim 18, further comprising:
depositing a second dielectric layer over the first transistor;
forming a second transistor on the second dielectric layer, wherein the forming the second transistor includes:
depositing a second semiconductor region over the second dielectric layer;
forming a second gate structure over the second semiconductor region; and
forming second silicide layers disposed adjacent to and on either side of the second semiconductor region, wherein the second silicide layers have a thickness, and wherein the thickness of the second silicide layers defines source/drain regions of the second transistor; and
fabricating a first metal interconnect that connects one of the source/drain regions of the first transistor to one of the source/drain regions of the second transistor.

20. The method of claim 19, further comprising:
depositing a third dielectric layer over the second transistor;
forming a memory cell over the third dielectric layer; and
fabricating a second metal interconnect that connects the other of the source/drain regions of the second transistor to the memory cell.

* * * * *